United States Patent [19]

Boivin

[11] Patent Number: 4,997,777

[45] Date of Patent: Mar. 5, 1991

[54] MANUFACTURING PROCESS FOR AN INTEGRATED CIRCUIT COMPRISING DOUBLE GATE COMPONENTS

[76] Inventor: Philippe Boivin, 11, Allée André Magnan, 13770 Venelles, France

[21] Appl. No.: 284,425

[22] Filed: Dec. 14, 1988

[30] Foreign Application Priority Data

Jan. 4, 1988 [FR] France ............... 88 00167

[51] Int. Cl.$^5$ ............... H01L 21/425; H01L 21/76; H01L 21/78
[52] U.S. Cl. ............................ 437/38; 437/43; 437/49; 437/52; 437/203
[58] Field of Search ............... 437/41, 42, 43, 49, 437/52, 38, 203

[56] References Cited

U.S. PATENT DOCUMENTS

| 4,635,347 | 1/1987 | Lien et al. .................. 156/653 X |
| 4,755,479 | 7/1988 | Miura .......................... 437/44 |
| 4,766,088 | 8/1988 | Kono et al. .................. 437/52 |

FOREIGN PATENT DOCUMENTS

| 0200364 | 3/1985 | European Pat. Off. . |
| 0209794 | 1/1987 | European Pat. Off. . |
| 0233823 | 8/1987 | European Pat. Off. . |

OTHER PUBLICATIONS

D. L. Bergeron et al., "Aluminum Gate Self-Aligned FET", IBM Technical Disclosure Bulletin, vol. 21, No. 8, Jan. 1979.

Primary Examiner—Olik Chaudhuri
Assistant Examiner—Ourmazd Ojan

[57] ABSTRACT

A process for manufacturing integrated circuits comprising insulated gate MOS transistors and double gate memory components, comprises the following steps: forming on the areas where the memory components will be formed a first insulating layer (2) and a first gate level (4); forming on the transistor areas and the memory areas a second insulating layer (5), a second gate level (6) and a first photoresist layer (7); etching the first photoresist layer and the second gate level according to chosen configurations; coating the transistor areas with a second photoresist layer (20). This process further comprises the following steps: selectively etching the second photoresist layer at the center of the places where the transistor drains and sources are to be formed; etching the apparent oxide areas and then the apparent gate and substrate areas; removing the second photoresist layer; and carrying out an ionic implantation of the drains and sources.

3 Claims, 2 Drawing Sheets

MANUFACTURING PROCESS FOR AN INTEGRATED CIRCUIT COMPRISING DOUBLE GATE COMPONENTS

BACKGROUND OF THE INVENTION

The instant invention relates to a process for manufacturing integrated circuits comprising, on the one hand, insulated gate MOS transistors provided with one gate level and, on the other hand, components provided with at least two gate levels, integrated on the same semiconductor substrate.

FIGS. 1A to 1F show the conventional manufacturing steps of an integrated circuit comprising, on the one hand, a MOS transistor on the left part of the figure and, on the other hand, a double gate component, for example a memory.

FIG. 1A shows an initial step of the process wherein, on a semiconductor substrate 1, for example a silicon substrate, one has formed, on the one hand, a thin layer of silicon oxide (hereinafter called oxide for the sake of simplicity) 2 and, on the other hand, a layer of thick oxide 3 designed to insulate two components one from the other.

During the step illustrated in FIG. 1B, one has formed above the structure a first polycrystalline silicon layer 4, a second layer of thin oxide (or another electrical insulator) 5, a second layer of polycrystalline silicon 6 coated with a resist mask 7, the structure being represented after photoetching of the resist mask 7 and of the second layer of the polycrystalline silicon 6 for delineating the upper gate of the memory type component and the FET gate.

During the step illustrated in FIG. 1C, one uses as a mask the openings previously formed for etching the oxide layer 5 and leaving in place a portion of the oxide layer 8 between the two gates of the memory type component and a portion of the oxide layer 9 under the MOS transistor gate. Besides, it will be noted that the oxide layer 9 remaining on the MOS transistor may result from a portion of the layer 2 formed during the step shown in FIG. 1A or from a portion of the layer 5 formed during the step shown in FIG. 1B, depending on whether the portion on which one forms the MOS transistor has been masked or not during either of the oxidation steps.

During the step illustrated in FIG. 1D, the photoetching of the first level of polycrystalline silicon 4 is shown, the etchings previously carried out being used as a mask. It will be noted that during this etching phase one etches, on the one hand, as it is deemed desirable, the polycrystalline silicon 4 and, on the other hand, the silicon substrate apparent on the MOS transistor whereby recesses 10 are formed in this substrate on both sides of the gate area of this MOS transistor.

Then, as shown in FIG. 1E, the oxide layer 2 is etched out. It will be noted that, during this etching phase, one overetches the silicon layers 8 and 9 previously etched under the polycrystalline silicon areas 6. In FIG. 1E, the upper resist layer 7, which besides could have been removed during the step represented in FIG. 1D according to some technologies, is no longer shown.

After the step illustrated in FIG. 1E, doping steps are generally carried out, usually by means of ionic implantation, for forming the source and drain regions of the components. Before or after this step, a thermal oxidation step will also be carried out for laterally insulating the gates.

FIG. 1F shows an enlarged although schematic view of the gate area of the MOS transistor after a reoxidation phase. Due to the presence of overetchings in the oxide layer 9, during the reoxidation phase, a dilatation of the oxide layer will occur as well as a raising of the gate edges. The same phenomenon occurs for the upper gate layer 6 of the memory type component. This raising phenomenon of the gate area presents a quite specific drawback when it relates to a MOS transistor because the threshold voltages are therefore not precisely determined due to the fact that improperly determined voltages are applied on the limits of the transistor channel area. The drawback is less important as regards the upper gate of the memory type component since the transfer phenomena which are produced between said gate and the underlying gate are not specifically correlated with the lateral fields.

Another drawback of the process according to FIG. 1E is due to the fact that, during the drain and source doping steps of the MOS transistor, because of the presence of the recess 10 in the drain and source areas, the resulting doping profile will not be precisely controlled at the limits of the channel area.

Thus, an object of the instant invention is to provide for a process for manufacturing an integrated circuit simultaneously comprising MOS transistors and multi-gate components avoiding the drawbacks of the prior art such as hereinabove described.

In order to achieve this purpose, the instant invention provides for a process for manufacturing integrated circuits comprising insulated gate MOS transistors and components provided with at least a double gate component on a semiconductor substrate, comprising the steps consisting in insulating by means of insulating regions the areas wherein the various components will be formed forming a first insulating layer and a first gate level on the areas where the multi-gate components will be formed ; forming on the transistor areas and the multi-gate areas a second insulating layer, at least a second gate level and a first level of photoresist ; etching the first layer of photoresist and the second gate level according to the configurations chosen in the transistor areas and in the multi-gate ; areas coating the transistor areas with a second layer of photoresist ; selectively etching the second layer of photoresist in the center of the places where the drains and sources of the transistors are to be formed ; etching the apparent oxide areas, then the apparent gate and substrate areas ; removing the second layer of photoresist ; and carrying out an ionic drain and source implantation in one single step, possibly preceded by a thermal step.

An advantage obtained by this process is that there is no longer any raising phenomenon of the gate such as hereinabove described more particularly in connection with FIG. 1F and, moreover, as it will be seen hereinafter, a profile particularly interesting for the gate and drain areas is obtained in one single implantation step, this profile being usually designated by LDD (low drain diffusion), to indicate there is a shallower doping area at the channel limits and a deeper and more highly doped area at the places where the drain and source contacts will be established.

Another advantage of this manufacturing process is, during the doping step, that the diffusion depth is limited to the boundaries of the field oxide areas, which permits to obtain MOS transistors operating at a higher voltage.

BRIEF DESCRIPTION OF THE DRAWINGS

Those objects, features, advantages and others of the instant invention will clearly appear from the following detailed description of preferred embodiments, in connection with the attached drawings, wherein.

In those various figures, the same references designate the same layers or layer portions. Moreover, as usual for the representation of integrated circuits, the various thicknesses and lateral sizes of the layers are not drawn to scale either inside one figure or from one figure to the other but have been arbitrarily drawn for the sake of a better legibility of the figures.

DETAILED DESCRIPTION OF THE DRAWINGS

Figure 1A:
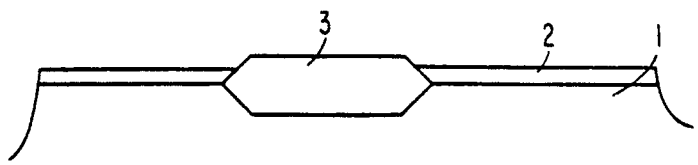
FIGS. 1A to 1F describe successive manufacturing steps of an integrated circuit according to the prior art.
Figure 1B:
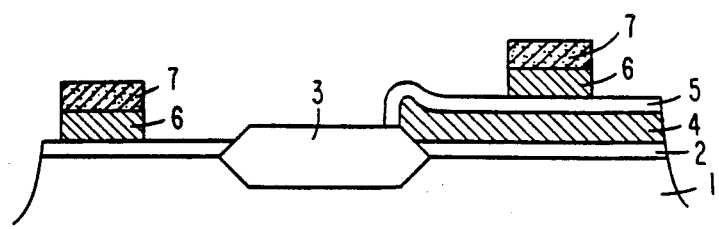
Figure 1C:
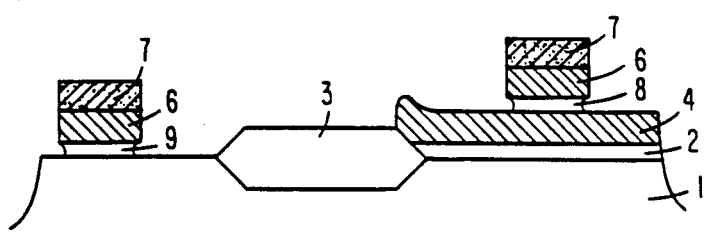
Figure 1D:
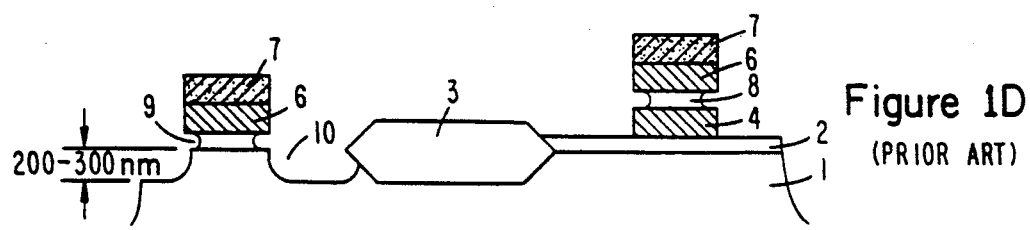
Figure 1E:
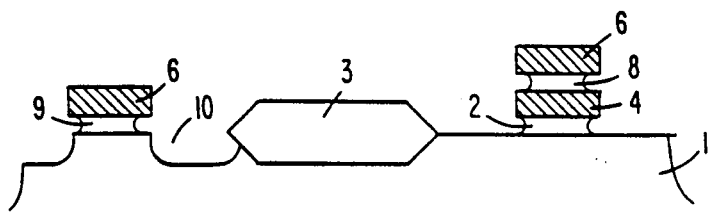
Figure 1F:
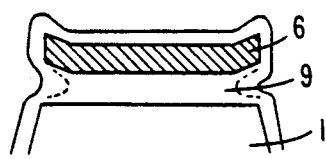
Figure 2A:
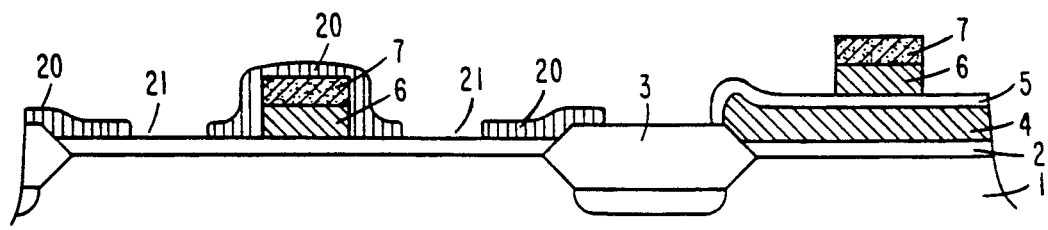
FIGS. 2A to 2C show successive manufacturing steps of an integrated circuit according to the instant invention.

FIG. 2A shows a first step of the process according to the instant invention which differs from the steps of the process according to the prior art illustrated in FIGS. 1A to 1F. More specifically, FIG. 2A shows the structure as it was during the step of the prior art illustrated in FIG. 1B with the addition of a resist layer 20 above the areas corresponding to one-gate MOS transistors.

This resist layer 20, while it is etched for being limited to the upper surface of the areas corresponding to the MOS transistors, is opened in the regions 21 which correspond to the central parts of the areas where the MOS transistor drains and sources are formed. Thus, as shown in FIG. 2A, some resist overlapping with respect to the edge of the field oxide areas 3 and overlapping with respect to the gate area 6 of the MOS transistors is left. In order to render selectively etchable the photoresist 20, it is possible to choose a resist different from the resist 7 which is used in the way hereinabove described in relation with FIG. 1B, or, it will be possible to choose the same resist while taking care to submit beforehand said resist 7 to a hardening process, for example in the presence of ultraviolet radiations.

Figure 2B:
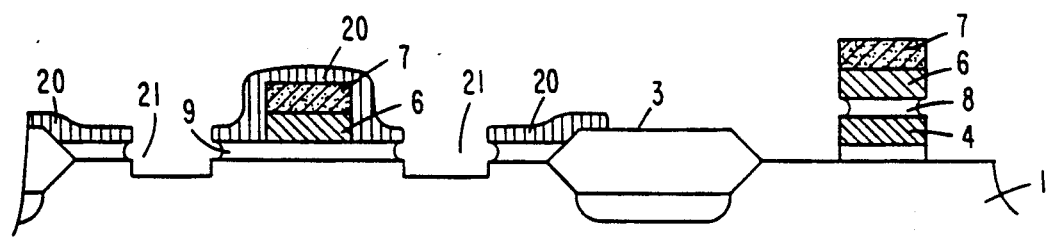

Then, the same steps as those illustrated in relation with FIGS. 1D and 1E are carried out but, as shown in FIG. 2B, only the central areas of the drain and source regions of the MOS transistors will be etched at the places 21 and the lateral etching of the oxide layer of gate 9 will not occur at the limit of the channel area but within said limit.

Figure 2C:
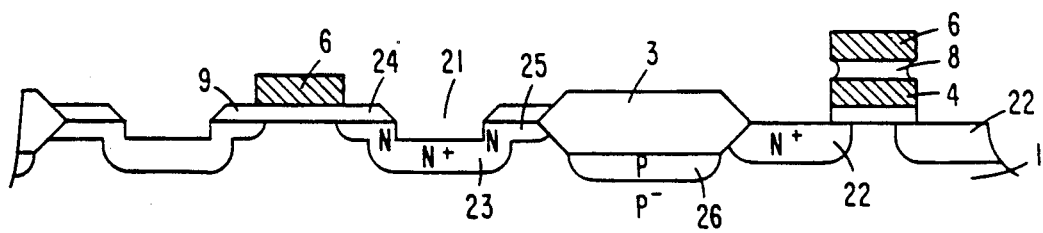

According to another advantage of the instant invention, as shown in FIG. 2C, if an ionic implantation step for the formation of drains and sources is carried out, for example an implantation adapted to supply a N+-type doping into a P− substrate, implanted areas 22 will be obtained on both sides of the double gate of the multi-gate component, for example a memory, as well as an implantation in the source and drain areas of the MOS transistors that can be differentiated into two parts : a deeper part 23 under the regions 21 due to the fact the implantation is carried out directly into the silicon and a shallower and less highly doped region 24 at the limits of the channel area due to the fact that the implantation is produced through the overlapping of the oxide layer of gate 9 and has been "filtered" by this oxide layer 9. This same filtering effect is produced in the areas 25 located at the neighbourhood of the field oxide layers 3.

FIG. 2C also shows a P-type implanted area 26 under the field oxide layer 3, usually called field implantation area and designed to increase the insulation between the adjacent components. One can see, owing to the process according to the invention, that the layer 25 is shallower in the area where it is at the neighbourhood of the field implantation layer 26. This increase in the distance between the drain or source implantation and the field implantation increases the breakdown voltage of the resulting MOS transistors.

As regards the structure of the doped source and drain areas at the neighbourhood of the gate area, it corresponds to what is conventionally called, as hereinabove mentioned, a LDD structure.

The instant invention is liable of various variations which will clearly appear to those skilled in the art. Thus, the protection of the one-gate transistor by the layer 20 could be carried out only partially, for example for the source side or the drain side. On the other hand, while a two-level gate memory has been essentially described as a multi-gate component, the invention can apply to any other multi-gate component combined with one-gate MOS transistors.

I claim:

1. A process for manufacturing integrated circuits comprising insulated gate MOS transistors and multi-gate devices on a semiconductor substrate, comprising the following steps:

using insulating regions, separating the areas wherein the MOS transistors are to be formed from the areas wherein the multi-gate devices are to be formed;

forming on the areas where the multi-gate devices are to be formed at least a first insulating layer and at least a first gate level;

forming on the transistor areas and the multi-gate device areas a second insulating layer, a second gate level and a first photoresist mask layer;

etching the first photoresist mask layer and the second gate level according to chosen patterns in the transistor areas and the areas of the multi-gate devices;

coating the transistor areas with a second photoresist mask layer;

selectively etching the second photoresist mask layer to form unmasked areas at the center of the places where the drains and sources of the transistors are to be formed;

etching the unmasked areas of said second insulating layer in both the transistor areas and the multi-gate device areas and then the unmasked gate area of the multi-gate areas and the unmasked substrate areas of the transistor areas;

removing the second photoresist mask layer; and carrying out an ionic implantation of the drains and sources in one single step.

2. A process according to claim 1, wherein the semiconductor substrate is a monocrystalline silicon substrate.

3. A process according to claim 2, wherein said gate levels are made of polycrystalline silicon.

* * * * *

UNITED STATES PATENT AND TRADEMARK OFFICE
CERTIFICATE OF CORRECTION

PATENT NO.   :   4,997,777
DATED        :   March 5, 1991
INVENTOR(S)  :   Philippe BOIVIN It is certified that error appears in the above-identified patent and that said Letters Patent is hereby corrected as shown below:

On the title page, please add the following:

[73]  Assignee:  SGS-THOMSON MICROELECTRONICS S.A., Gentilly, France.

Signed and Sealed this

Thirteenth Day of April, 1993

*Attest:*

STEPHEN G. KUNIN

*Attesting Officer*      Acting Commissioner of Patents and Trademarks